(12) United States Patent
Katou

(10) Patent No.: US 7,960,824 B2
(45) Date of Patent: Jun. 14, 2011

(54) SEMICONDUCTOR DEVICE INCLUDING POWER SUPPLY PAD AND TRUNK WIRING WHICH ARE ARRANGED AT THE SAME LAYER LEVEL

(75) Inventor: Tetsuya Katou, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 117 days.

(21) Appl. No.: 12/461,511

(22) Filed: Aug. 13, 2009

(65) Prior Publication Data

US 2010/0072625 A1 Mar. 25, 2010

(30) Foreign Application Priority Data

Sep. 22, 2008 (JP) .................................. 2008-241987

(51) Int. Cl.
*H01L 23/52* (2006.01)
(52) U.S. Cl. ........ 257/691; 257/690; 257/734; 257/773; 257/776; 257/784; 257/E23.079
(58) Field of Classification Search .......... 257/666–796, 257/23.001–E23.194
See application file for complete search history.

(56) References Cited

U.S. PATENT DOCUMENTS

| 5,119,168 | A  | * | 6/1992  | Misawa ......................... 257/691 |
| 6,586,828 | B2 | * | 7/2003  | Buffet et al. ................... 257/691 |
| 7,638,871 | B2 | * | 12/2009 | Noda et al. ..................... 257/691 |
| 2003/0067066 | A1 | * | 4/2003 | Kondou ......................... 257/691 |
| 2004/0124521 | A1 | * | 7/2004 | Al-Dabagh et al. .......... 257/691 |
| 2005/0051898 | A1 | * | 3/2005 | Minami et al. ................ 257/750 |

FOREIGN PATENT DOCUMENTS

| JP | 61-193467   | 8/1986  |
| JP | 2006-313765 | 11/2006 |

* cited by examiner

*Primary Examiner* — Jasmine J Clark
(74) *Attorney, Agent, or Firm* — McGinn IP Law Group, PLLC

(57) ABSTRACT

A semiconductor device includes a semiconductor substrate which includes a functional circuit, a trunk wiring which passes through a portion near a position immediately above a center portion of the functional circuit, a power supply pad which is connected to an end of the trunk wiring and placed at a layer level which is same as a layer level where the trunk wiring is placed, and a connection wiring which connects a substantially center portion of the functional circuit and the trunk wiring.

16 Claims, 6 Drawing Sheets

SEMICONDUCTOR DEVICE INCLUDING POWER SUPPLY PAD AND TRUNK WIRING WHICH ARE ARRANGED AT THE SAME LAYER LEVEL

INCORPORATION BY REFERENCE

This application is based upon and claims the benefit of priority from Japanese Patent Application No. 2008-241987 which was filed on Sep. 22, 2008, the disclosure of which is incorporated herein in its entirety by reference.

BACKGROUND OF THE INVENTION

1. Field of the Invention

The present invention relates to a semiconductor device.

2. Description of Related Art

In a semiconductor device, a plurality of wiring layers are formed on a semiconductor substrate on which a functional circuit with high power consumption, such as a CPU (Central Processing Unit), a ROM (Read Only Memory), or a RAM (Random Access Memory), is formed. A power supply wire is formed at each wiring layer, and the power supply wires of the wiring layers are electrically connected to each other through vias. The power supply wire at the wiring layer serving as the bottom layer is electrically connected to the functional circuit via a contact hole. A power supply pad is electrically connected to the power supply wire at the wiring layer serving as the top layer. Power is supplied from the power supply pad to the functional circuit through the power supply wires of the wiring layers. In this case, a voltage drop tends to increase with an increase in the distance from the power supply pad when viewed from a planar perspective. In other words, the semiconductor device has, e.g., the problem of a low capability for supplying power to a substantially center portion of the functional circuit which is far from the power supply pad when viewed from the planar perspective.

For this reason, the semiconductor devices in Patent Documents 1 and 2 each have a reinforcement power supply wire to reinforce a portion where the semiconductor device has a large voltage drop and has a low power supply capability. More specifically, in the semiconductor device of each of Patent Documents 1 and 2, a power supply pad is electrically connected to a ring wire. One end of the reinforcement power supply wire is electrically connected to the ring wire. The other end of the reinforcement power supply wire extends to, e.g., a substantially center portion of a functional circuit which is the portion where the semiconductor device has a low power supply capability and is electrically connected to the substantially center portion. The ring wire and the power supply pad are formed at different layers. The ring wire and the power supply pad are connected through a via.

Note that the semiconductor device in Patent Document 2 is configured such that the width dimension of the reinforcement power supply wire is changed depending on the distance from the power supply pad to a portion where the semiconductor device has a low power supply capability when viewed from a planar perspective.

[Patent Document 1] Japanese Patent Application Laid Open No. 61-193467

[Patent Document 2] Japanese Patent Application Laid Open No. 2006-313765

SUMMARY

In the semiconductor device in each of Patent Documents 1 and 2 described above, the power supply pad and the ring wire are connected to each other through the via. The via is of high resistance, and the power supply capability significantly decreases.

A semiconductor device includes a semiconductor substrate including a functional circuit, a trunk wiring which passes through a portion near a position immediately above a center portion of the functional circuit, a power supply pad which is connected to an end of the trunk wiring and placed at a layer level which is same as a layer level where the trunk wiring is placed, and a connection wiring which connects a substantially center portion of the functional circuit and the trunk wiring.

With this configuration, the semiconductor device is capable of efficiently supplying power to a portion near the center portion of the functional circuit of the semiconductor substrate and has a high power supply capability.

According to the present invention, it is possible to provide a semiconductor device with a high power supply capability.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DESCRIPTION OF THE EXEMPLARY EMBODIMENTS

First Exemplary Embodiment

Figure 1:
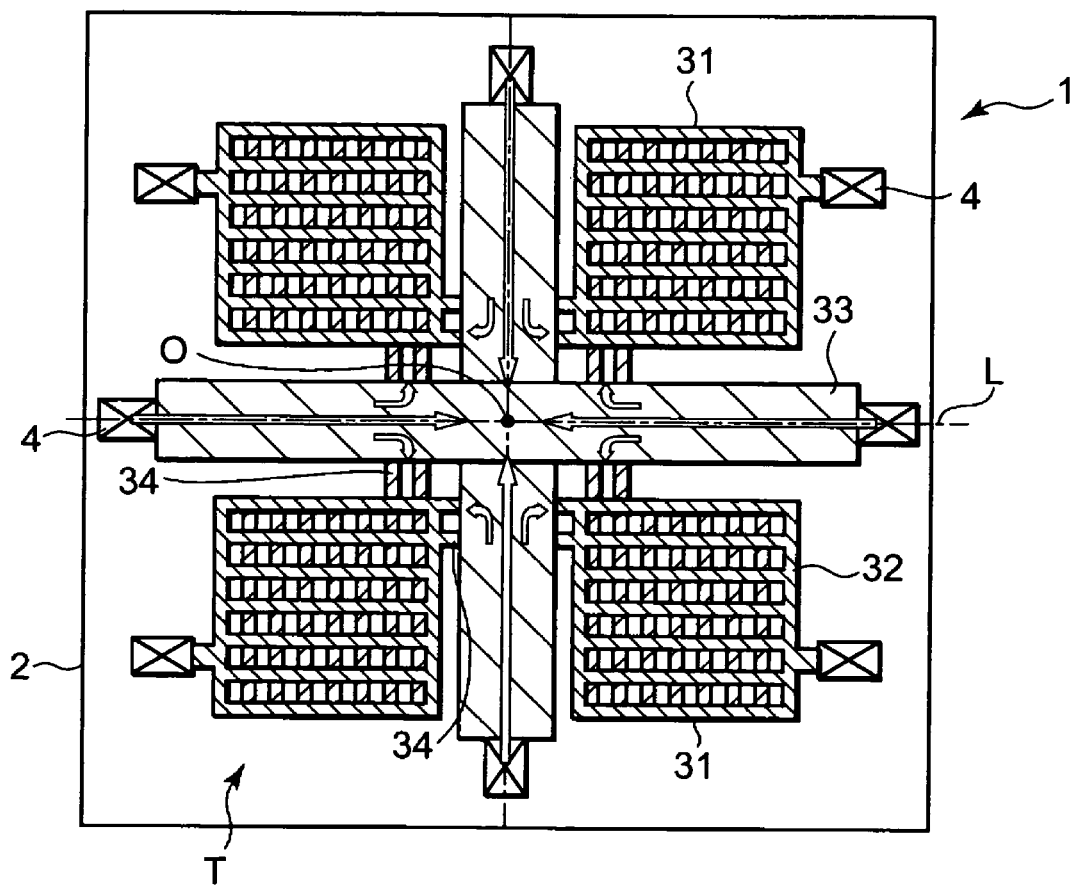
FIG. 1 is a plan view schematically showing a semiconductor device of a first exemplary embodiment according to the present invention.
Figure 2:
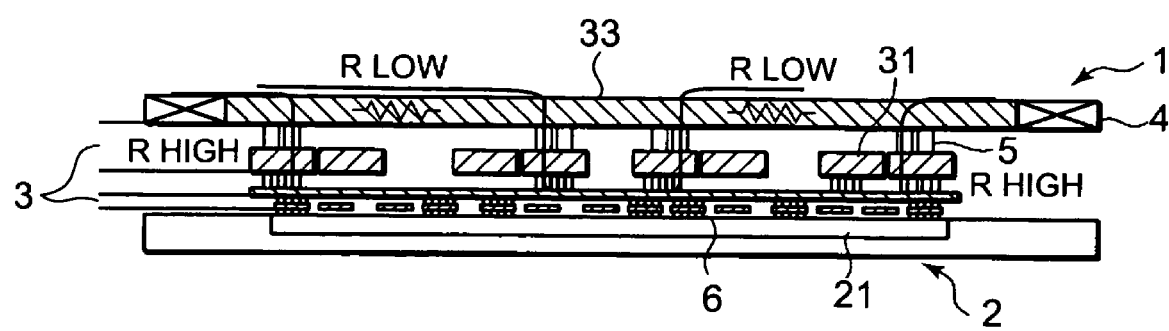
FIG. 2 is a vertical cross-sectional view schematically showing the semiconductor device of the first exemplary embodiment according to the present invention.

A semiconductor device 1 of an exemplary embodiment includes a semiconductor substrate 2, a wiring layer 3, and a power supply pad 4, as shown in FIGS. 1 and 2.

The semiconductor substrate 2 is a semiconductor substrate on which a functional circuit 21 with high power consumption, such as a CPU, a ROM, or a RAM, that is a type of transistor is formed. Note that although the semiconductor substrate is shown to have only one functional circuit 21 in the exemplary embodiment, for illustrative simplicity, a large number of functional circuits and a circuit with low power consumption are formed on the semiconductor substrate, as will be described later.

A plurality of the wiring layers 3 are stacked on the functional circuit 21 of the semiconductor substrate 2. Distribution wires 31 through which power is supplied to the semiconductor substrate 2 are formed at each wiring layer 3. Each distribution wire 31 extends in a transverse direction or a longitudinal direction when viewed from a planar perspective. As for ends of the distribution wires 31, adjacent distribution wires 31 are connected to each other through an end wire 32.

The distribution wires 31 extending in the transverse direction and the distribution wires 31 extending in the longitudinal direction are stacked in order in a vertical direction and are arranged in a grid when viewed from the planar perspective. The distribution wires 31 of the exemplary embodiment are stacked in four layers, as shown in FIG. 2. An interlayer dielectric film is formed between sets of the distribution wires 31 which are arranged vertically adjacent to each other. The sets of the distribution wires 31 arranged vertically adjacent to each other are electrically connected through vias 5 formed in the interlayer dielectric film. An interlayer dielectric film is also formed between the distribution wires 31 of the wiring layer 3 serving as the bottom layer and the functional circuit 21 of the semiconductor substrate 2. The distribution wires 31 of the wiring layer 3 serving as the bottom layer and the functional circuit 21 of the semiconductor substrate 2 are electrically connected through contact holes 6 formed in the interlayer dielectric film.

Trunk (main) wires 33 are formed at the wiring layer 3 serving as the top layer. Each trunk wire 33 passes through a portion where a voltage drop remains large until the functional circuit 21 becomes inoperable or malfunctions. That is, the trunk wire 33 passes through a portion near a position immediately above a center portion O of the functional circuit 21. The trunk wires 33 of the exemplary embodiment extend in the transverse direction and the longitudinal direction and are formed to cross when viewed from the planar perspective. An intersection of the trunk wires 33 is arranged near the position immediately above the center portion O of the functional circuit 21. Note that the trunk wire 33 extending in one of the transverse direction and the longitudinal direction may be formed to be divided at the intersection with the trunk wire 33 extending in the other direction.

The distribution wires 31 are formed in a region T which is demarcated by adjacent ones of the trunk wires 33 at the wiring layer 3 when viewed from the planar perspective.

The connection relationship between the trunk wire 33 and the distribution wires 31 formed at the same layer as the trunk wire 33 will be described. In the exemplary embodiment, the trunk wire 33 extending in the longitudinal direction is electrically connected to the distribution wires 31 extending in the transverse direction at the same layer as the trunk wire 33. That is, the trunk wire 33 is electrically connected to the end wires 32 for the distribution wires 31 through connection wires 34 at the same layer. A connection between each end wire 32 (the trunk wire 33) and the distribution wires 31 is located near a position immediately above the center portion O of the functional circuit 21 of the semiconductor substrate 2. The width dimension of the trunk wire 33 is made larger than the width dimensions of the connection wires 34 and the distribution wires 31.

The connection relationship between the trunk wire 33 and the distribution wires 31 formed at the wiring layer 3 serving as the second layer from the top will be described. In the exemplary embodiment, the trunk wire 33 extending in the transverse direction is electrically connected to the distribution wires 31 extending in the longitudinal direction at the wiring layer 3 serving as the second layer from the top. That is, each connection wire 34 extending to a position immediately below the trunk wire 33 is electrically connected to the corresponding end wire for the distribution wires 31 at the wiring layer 3 serving as the second layer from the top. The trunk wire 33 is electrically connected to the connection wires 34 through the vias 5. A connection between the trunk wire 33 and the distribution wires 31 is located near the position immediately above the center portion O of the functional circuit 21 of the semiconductor substrate 2. The distribution wires 31, 32, which are provided at the top layer and the second layer from the top may be arranged in a ring shape to supply the power supply voltage to all wires 31, 32 at each of layer level, respectively.

Note that directions in which the trunk wires 33 and the distribution wires 31 extend and the connection relationships between the trunk wires 33 and the distribution wires 31 are not limited to the above-described ones and are appropriately modified.

In this case, some of the vias 5 connecting the sets of the distribution wires of the wiring layers 3 serving as the third and subsequent layers from the top are formed near a position immediately above the center portion O of the functional circuit 21 of the semiconductor substrate 2. Some of the contact holes 6 connecting the distribution wires 31 of the wiring layers 3 serving as the bottom layer and the functional circuit 21 of the semiconductor substrate 2 are also formed near a position immediately above the center portion O of the functional circuit 21. As a result, the trunk wires 33 are connected to the functional circuit 21 near the position of the center portion O using, as connection wiring between the trunk wires 33 and the functional circuit 21, the connection wires 34 connecting the trunk wires 33 and the distribution wires 31, the vias 5 connecting the sets of the distribution wires, and the contact holes 6 connecting the distribution wires 31 and the functional circuit 21.

The power supply pads 4 formed at the same layer as each trunk wire 33 are electrically connected to two ends of the trunk wire 33. That is, the trunk wire 33 and the power supply pads 4 are formed at the same layer and are connected without the mediacy of high-resistance vias. For this reason, the resistance is low, and power supply can be efficiently performed. In this case, the width dimension of each trunk wire 33 is preferably made larger than those of the power supply pads 4. This configuration makes it possible to reduce the drawing resistance from each power supply pad 4 into the trunk wire 33 and more efficiently perform power supply.

Generally, in the case of a semiconductor device configured such that each power supply pad is arranged outside, before current is drawn to a center portion of the semiconductor substrate 2 at the top layer, the current is drawn into the wiring layer serving as a lower layer, and power cannot be efficiently supplied to the center portion O of the functional circuit 21, depending on the balance in wiring resistance between wiring layers or within the same layer. In contrast, in the semiconductor device 1 of the present invention, the power supply pads 4 are formed at the ends of the trunk wire 33 extending in the transverse direction or the longitudinal direction. That is, since the power supply pads 4 are formed on an axis L of each trunk wire 33, the distance from each power supply pad 4 to the portion near the position immediately above the center portion O of the functional circuit 21 is the shortest distance. For this reason, in the semiconductor device 1, current is satisfactorily drawn to the center portion O of the functional circuit 21, as shown in FIG. 2. Accordingly, the semiconductor device 1 is capable of efficiently performing power supply.

Figure 3:
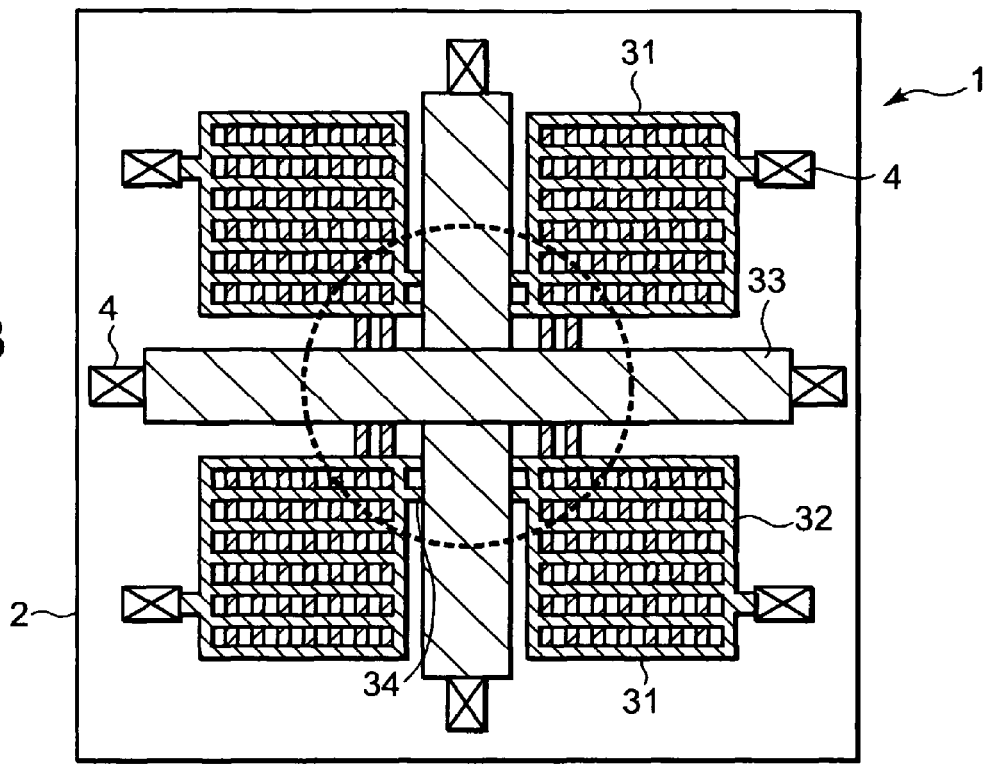
FIG. 3 is a view showing a region to which power is supplied by trunk wires.

With the above-described configuration, the semiconductor device 1 of the present invention is capable of efficiently supplying power to a portion near the center portion of the functional circuit 21 of the semiconductor substrate 2, as shown in FIG. 3, and has a high power supply capability.

Figure 4:
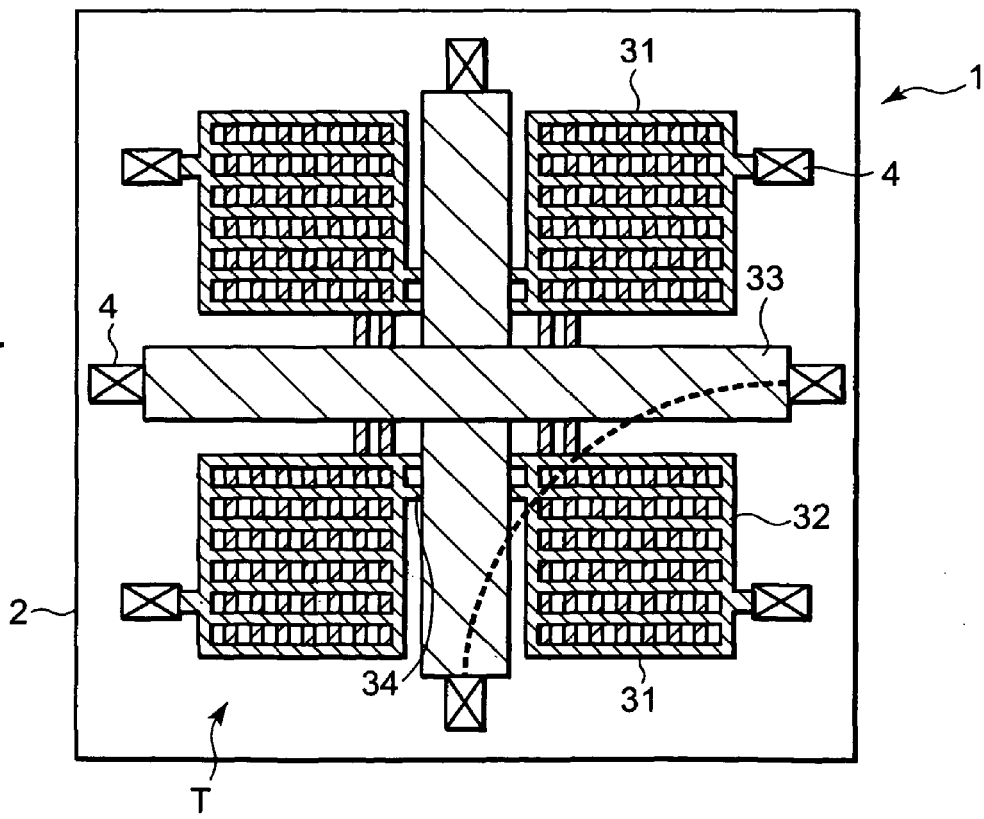
FIG. 4 is a view showing a region to which power is supplied by power supply pads connected to distribution wires.

Note that FIG. 3 shows a region covered by supply of power from the trunk wires 33 (a region surrounded by a broken line in FIG. 3 is the covered region). The remaining regions are covered by supply of power from the power supply pads 4 electrically connected to the distribution wires 31 at the top layer, as shown in FIG. 4.

Figure 5:
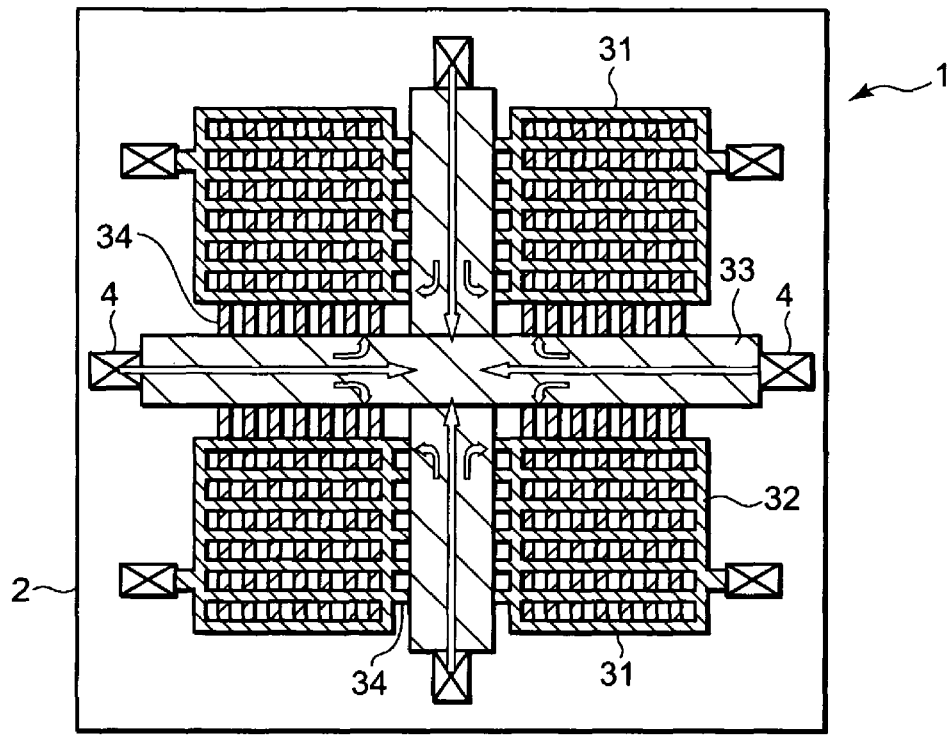
FIG. 5 is a plan view schematically showing a different semiconductor device of the first exemplary embodiment according to the present invention.

In the semiconductor device 1 of the exemplary embodiment, only portions near the position immediately above the center portion O of the functional circuit 21 of the semiconductor substrate 2 in each trunk wire 33 are connected to the distribution wires 31. The present invention, however, is not limited to this structure. Other portions of the trunk wire 33 may be connected to the distribution wires 31 to the extent that the resistance balance within each wiring layer is not lost, as shown in FIG. 5.

Figure 6:
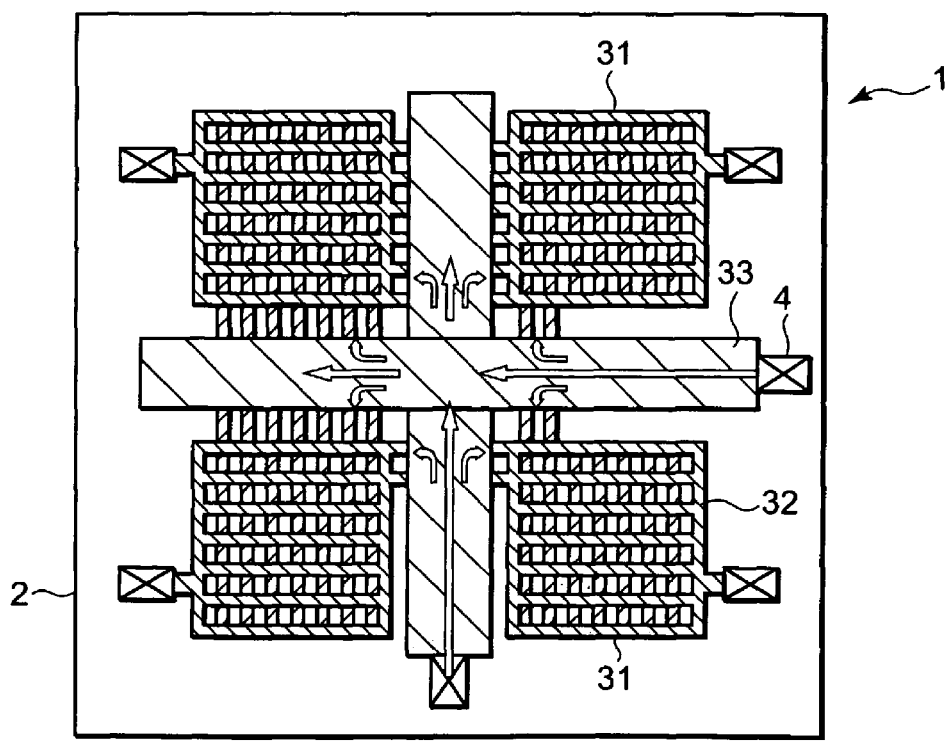
FIG. 6 is a plan view schematically showing a different semiconductor device of the first exemplary embodiment according to the present invention.
Figure 7:
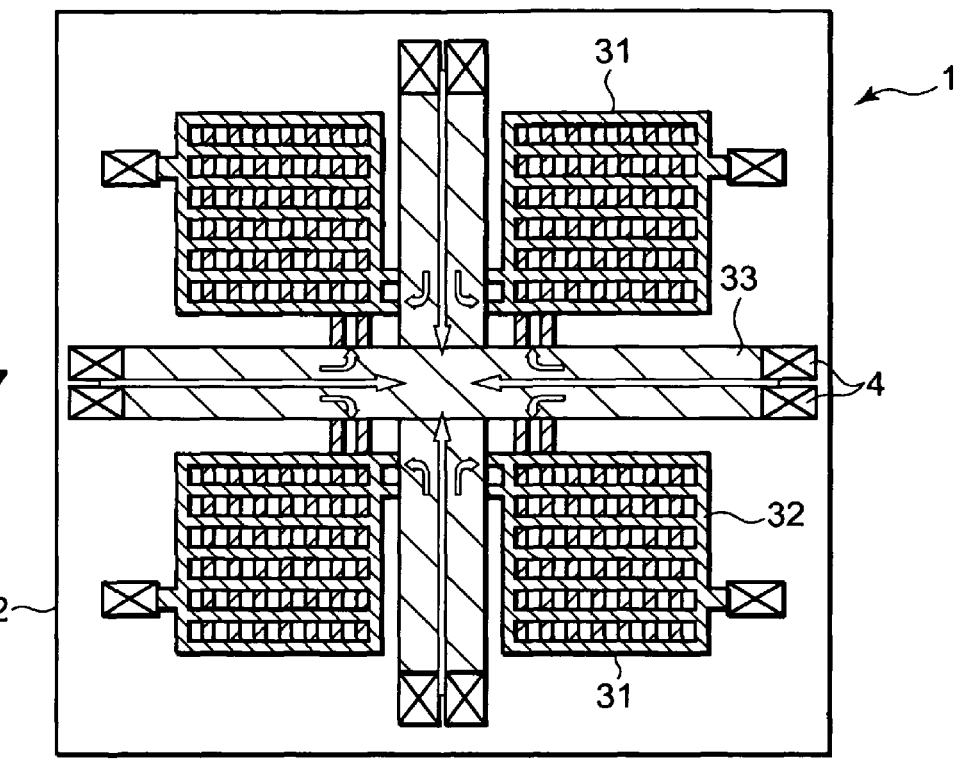
FIG. 7 is a plan view schematically showing a different semiconductor device of the first exemplary embodiment according to the present invention.

Although the power supply pads 4 are formed at the two ends of each trunk wire 33 in the semiconductor device 1 of the exemplary embodiment, the present invention is not limited to this structure. As shown in FIG. 6, the power supply pad 4 may be formed at one end of the trunk wire 33. Additionally, the number of power supply pads 4 is not particularly limited, and a plurality of (two in the shown example) power supply pads 4 may be formed at each end of the trunk wire 33, as shown in FIG. 7. In this case, although each power supply pad 4 is off the axis L of the trunk wire 33, the power supply pad 4 only has to be formed on an extension of the trunk wire 33.

Second Exemplary Embodiment

A semiconductor device 100 of a second exemplary embodiment is configured to be almost the same as the semiconductor device 1 of the first exemplary embodiment described above. However, the semiconductor device 100 is different in layout of a trunk wire 33, a distribution wire 31, and the like. For this reason, a description of same components will be omitted.

Figure 8:
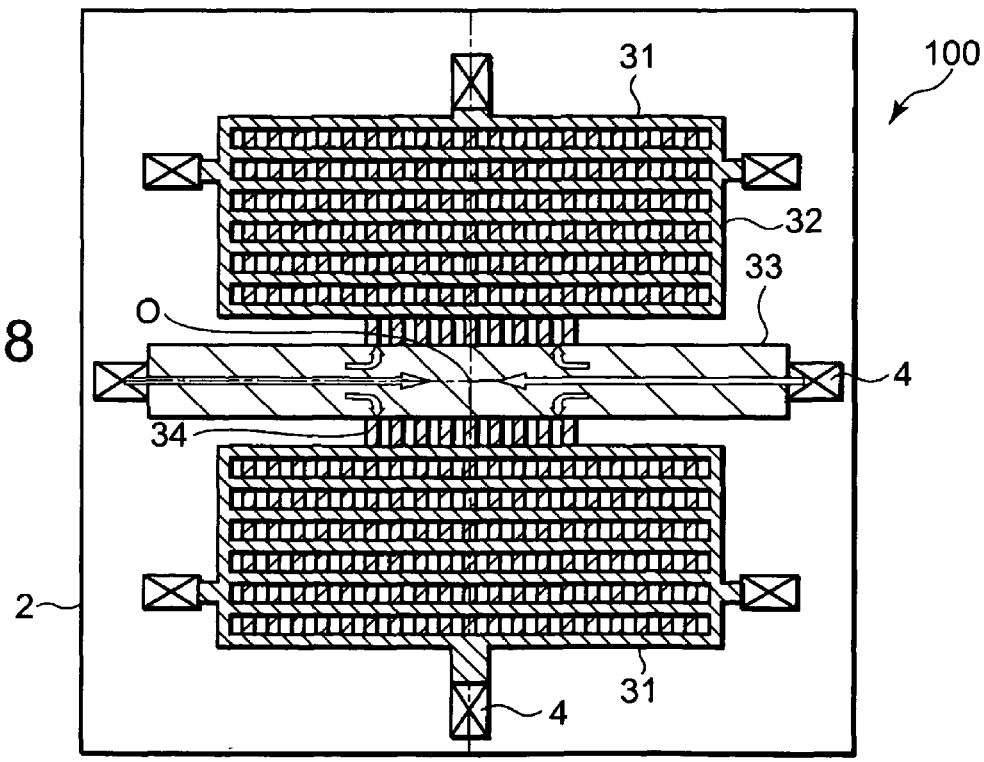
FIG. 8 is a plan view schematically showing a semiconductor device of a second exemplary embodiment according to the present invention.

In the semiconductor device 100 of the second exemplary embodiment, the trunk wire 33 is formed only in a transverse direction, as shown in FIG. 8. In this case as well, the trunk wire 33 passes through a portion near a position immediately above a center portion O of a functional circuit 21 of a semiconductor substrate 2. Distribution wires 31 are formed on two sides of the trunk wire 33 at a wiring layer 3 when viewed from a planar perspective. The trunk wire 33 is electrically connected to the distribution wires 31 at the portion near the position immediately above the center portion O of the functional circuit 21 of the semiconductor substrate 2. The trunk wire 33 is electrically connected, through a via 5, to a connection wire 34 which is connected to the distribution wires 31 at the second layer from the top. Note that power supply pads 4 are electrically connected to the distribution wires 31 at the top layer.

With the above-described configuration, it is possible to efficiently supply power to the center portion O of the functional circuit 21 of the semiconductor substrate 2, as in the semiconductor device 1 of the first exemplary embodiment.

Figure 9:
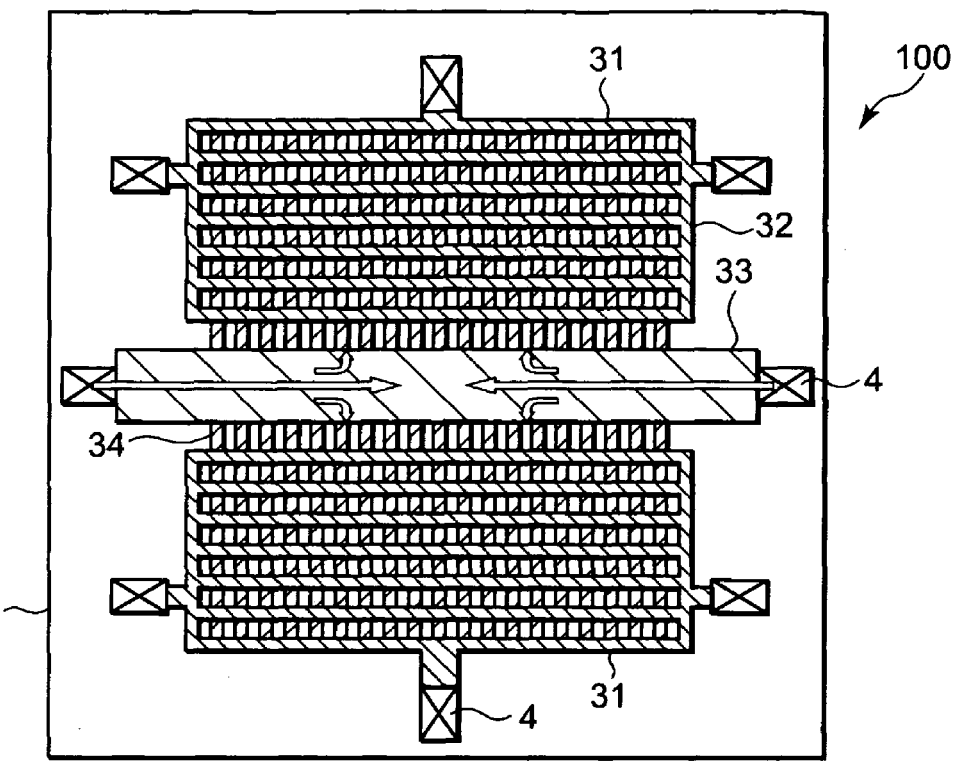
FIG. 9 is a plan view schematically showing a different semiconductor device of the second exemplary embodiment according to the present invention.

In the semiconductor device 100 as well, only a portion near the position immediately above the center portion 0 of the functional circuit 21 of the semiconductor substrate 2 in the trunk wire 33 is connected to the distribution wires 31. The present invention, however, is not limited to this structure. Other portions of the trunk wire 33 may be connected to the distribution wires 31 to the extent that the resistance balance within each wiring layer is not lost, as shown in FIG. 9.

Figure 10:
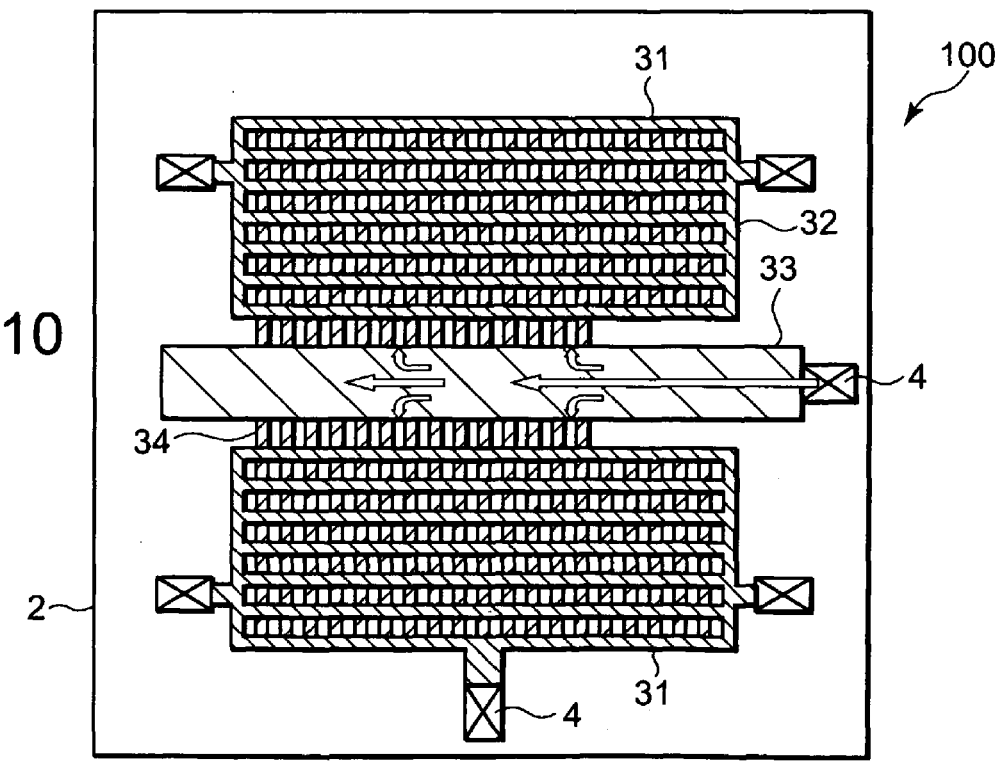
FIG. 10 is a plan view schematically showing a different semiconductor device of the second exemplary embodiment according to the present invention.
Figure 11:
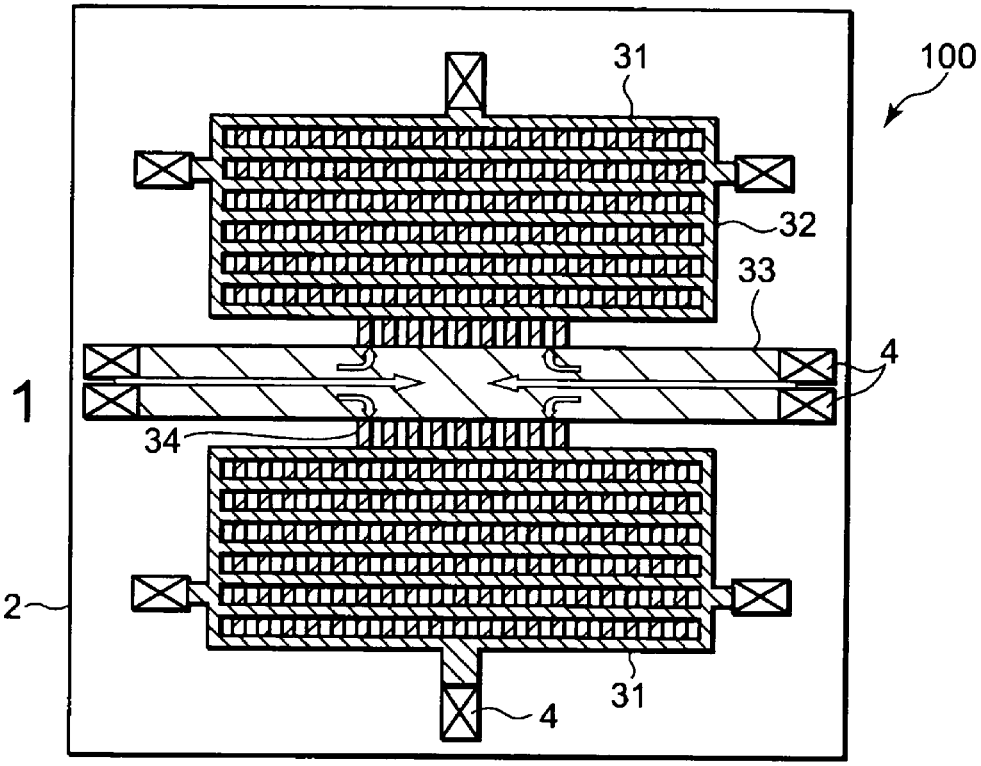
FIG. 11 is a plan view schematically showing a different semiconductor device of the second exemplary embodiment according to the present invention.

Although the power supply pads 4 are formed at two ends of the trunk wire 33 in the semiconductor device 100 of the above-described exemplary embodiment, the present invention is not limited to this structure. As shown in FIG. 10, the power supply pad 4 may be formed at one end of the trunk wire 33. Additionally, the number of power supply pads 4 is not particularly limited, and a plurality of (two in the shown example) power supply pads 4 may be formed at each end of the trunk wire 33, as shown in FIG. 11. In this case, although each power supply pad 4 is off an axis L of the trunk wire 33, the power supply pad 4 only has to be formed on an extension of the trunk wire 33.

Third Exemplary Embodiment

In each of the semiconductor devices of the first and second exemplary embodiments described above, only one functional circuit is formed on the semiconductor substrate 2. The present invention, however, is not limited to this structure.

Figure 12:
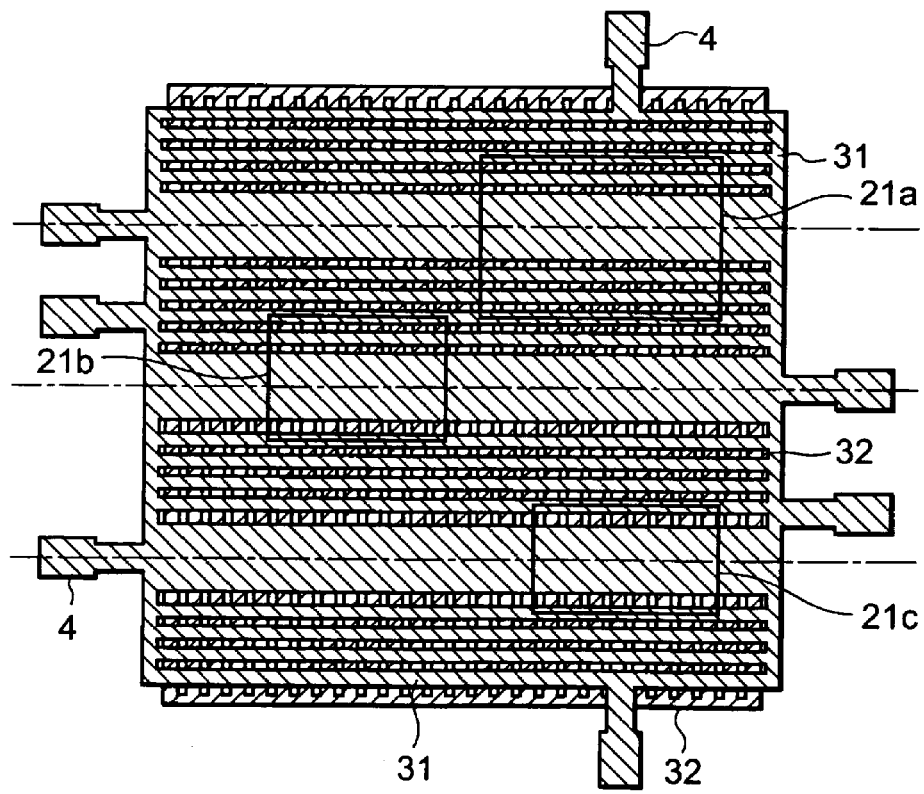
FIG. 12 is a plan view schematically showing a semiconductor device of a third exemplary embodiment according to the present invention.

As shown in FIG. 12, a plurality of functional circuits 21a to 21c, such as a CPU and a RAM, may be formed. In this case as well, a trunk wire 33 is formed to pass through a portion near a position immediately above a center portion of each of the functional circuits 21a to 21c.

Exemplary embodiments of a semiconductor device according to the present invention have been described above. The present invention, however, is not limited to the above-described exemplary embodiments, and various changes may be made without departing from the scope of the present invention.

Further, it is noted that Applicant's intent is to encompass equivalents of all claim elements, even if amended later during prosecution.

What is claimed is:

1. A semiconductor device, comprising:
   a semiconductor substrate which includes a functional circuit;
   a trunk wiring which passes through a portion near a position immediately above a center portion of the functional circuit;
   a power supply pad which is connected to an end of the trunk wiring and placed at a layer level which is same as a layer level where the trunk wiring is placed; and
   a connection wiring which connects a substantially center portion of the functional circuit and the trunk wiring.

2. The semiconductor device according to claim 1, wherein the power supply pad is arranged above and near an axis of the trunk wiring.

3. The semiconductor device according to claim 1, wherein the trunk wiring has a width dimension larger than a width dimension of the connection wiring.

4. The semiconductor device according to claim 1,
   wherein the trunk wiring includes a first elongated portion and a second elongated portion which are crossed to each other, and an intersection of the first and second elongated portions of the trunk wiring is arranged near the position immediately above the center portion of the functional circuit, the semiconductor device further comprising:

a distribution wiring arranged in a region demarcated by adjacent first and second elongated portions of the trunk wiring, wherein the distribution wiring includes a portion near the position immediately above the center portion of the functional circuit, which is connected to the trunk wiring through the connection wiring.

5. The semiconductor device according to claim 1, wherein the trunk wiring is arranged in a transverse direction or a longitudinal direction of the semiconductor substrate, the semiconductor device further comprising:

a distribution wiring arranged on each of two sides of the trunk wiring, wherein the distribution wiring includes a portion near the position immediately above the center portion of the functional circuit, which is connected to the trunk wiring through the connection wiring.

6. The semiconductor device according to claim 1, wherein the power supply pad is connected to only one end of the trunk wiring.

7. The semiconductor device according to claim 1, wherein the power supply pad is connected to each of two ends of the trunk wiring.

8. The semiconductor device according to claim 1, wherein a plurality of the power supply pads including the power supply pad are formed at the end of the trunk wiring.

9. The semiconductor device according to claim 4, wherein the power supply pad is connected to the distribution wiring.

10. A semiconductor device, comprising:

a semiconductor substrate which includes a functional circuit;

a power supply pad arranged at a first layer level over the semiconductor substrate;

a trunk wiring which extends in a first direction to pass through immediately above a center portion of the functional circuit, and which is arranged at the first layer level to be connected to the power supply pad; and a first distribution wiring arranged at the first layer level and connected to the trunk wiring;

a second distribution wiring which is arranged at a second layer level between the first layer level and the semiconductor substrate, and which extends in a second direction perpendicular to the first direction so that the second distribution wiring overlaps with the trunk wiring at an overlapping portion, the second distribution wiring being electrically connected to the functional circuit; and a via arranged at the overlapping portion to connect the second distribution wiring and the trunk wiring.

11. The semiconductor device, as claimed in claim 10, further comprising:

a second power supply pad arranged at the first layer level and connected to the first distribution wiring.

12. The semiconductor device, as claimed in claim 11, wherein:

the power supply pad comprises a first power supply pad;

the first power supply pad has a width smaller than a width of the trunk wiring; and the second power supply pad has a width larger than a width of the first distribution wiring.

13. The semiconductor device, as claimed in claim 10, further comprising:

a second trunk wiring extending in the second direction and arranged at the first layer level.

14. The semiconductor device, as claimed in claim 10, wherein:

a plurality of power supply pads including the power supply pad are connected to an end of the trunk wiring.

15. The semiconductor device, as claimed in claim 10, wherein the first distribution wiring is arranged in at least a ring shape.

16. The semiconductor device, as claimed in claim 15, wherein the second distribution wiring is arranged in at least a ring shape.

* * * * *